US011745702B2

(12) United States Patent
Uprety et al.

(10) Patent No.: US 11,745,702 B2
(45) Date of Patent: Sep. 5, 2023

(54) COATING INCLUDING ELECTRICALLY CONDUCTIVE LINES DIRECTLY ON ELECTRICALLY CONDUCTIVE LAYER

(71) Applicant: PPG INDUSTRIES OHIO, INC., Cleveland, OH (US)

(72) Inventors: Krishna Kamal Uprety, Valencia, CA (US); Alexander Zirom Bimanand, Burbank, CA (US); Khushroo Homi Lakdawala, Chatsworth, CA (US)

(73) Assignee: PPG INDUSTRIES OHIO, INC., Cleveland, OH (US)

( * ) Notice: Subject to any disclaimer, the term of this patent is extended or adjusted under 35 U.S.C. 154(b) by 0 days.

(21) Appl. No.: 16/710,047

(22) Filed: Dec. 11, 2019

(65) Prior Publication Data

US 2020/0180562 A1    Jun. 11, 2020

Related U.S. Application Data

(60) Provisional application No. 62/777,790, filed on Dec. 11, 2018.

(51) Int. Cl.
| | | |
|---|---|---|
| *B60S 1/02* | (2006.01) | |
| *H01B 5/14* | (2006.01) | |
| *H01B 1/08* | (2006.01) | |
| *H05K 9/00* | (2006.01) | |
| *H01B 1/02* | (2006.01) | |
| *G01K 7/16* | (2006.01) | |
| *B60J 1/00* | (2006.01) | |

(52) U.S. Cl.
CPC ............... *B60S 1/026* (2013.01); *H01B 1/02* (2013.01); *H01B 1/08* (2013.01); *H01B 5/14* (2013.01); *H05K 9/009* (2013.01); *B60J 1/00* (2013.01); *G01K 7/16* (2013.01); *Y10T 428/24917* (2015.01)

(58) Field of Classification Search
None
See application file for complete search history.

(56) References Cited

U.S. PATENT DOCUMENTS

| | | | |
|---|---|---|---|
| 2,676,117 A | 4/1954 | Colbert et al. | |
| 3,773,514 A | 11/1973 | Fromson | |
| 3,775,157 A | 11/1973 | Fromson | |
| 4,017,661 A | 4/1977 | Gillery | |
| 4,128,448 A | 12/1978 | Bitterice et al. | |
| 4,211,910 A | 7/1980 | Kusunoki et al. | |
| 4,338,000 A | 7/1982 | Kamimori et al. | |
| 4,652,090 A | 3/1987 | Uchikawa et al. | |
| 4,671,619 A | 6/1987 | Kamimori et al. | |
| 4,768,865 A | 9/1988 | Greenberg et al. | |
| 4,859,532 A | 8/1989 | Oyama et al. | |
| 4,932,755 A | 6/1990 | Holdridge et al. | |
| 5,066,111 A | 11/1991 | Singleton et al. | |
| 5,071,206 A | 12/1991 | Hood et al. | |
| 5,142,407 A | 8/1992 | Varaprasad et al. | |
| 5,359,149 A | 10/1994 | Seike et al. | |
| 5,472,643 A | 12/1995 | Varaprasad et al. | |
| 5,525,401 A | 6/1996 | Hirmer | |
| 5,668,663 A | 9/1997 | Varaprasad et al. | |
| 5,724,176 A | 3/1998 | Nishikitani et al. | |
| 6,030,708 A | 2/2000 | Ishibashi et al. | |
| 6,317,248 B1 | 11/2001 | Agrawal et al. | |
| 6,594,067 B2 | 7/2003 | Poll et al. | |
| 6,906,842 B2 | 6/2005 | Agrawal et al. | |
| 7,256,923 B2 | 8/2007 | Liu et al. | |
| 7,450,294 B2 | 11/2008 | Weidner | |
| 7,688,495 B2 | 3/2010 | Tonar et al. | |
| 7,736,693 B2 | 6/2010 | Garbar et al. | |
| 7,824,580 B2 | 11/2010 | Boll et al. | |
| 7,906,732 B2 | 3/2011 | Okahata et al. | |
| 8,115,984 B2 | 2/2012 | Agrawal et al. | |
| 8,198,810 B2 | 6/2012 | Lim et al. | |
| 8,425,792 B2 | 4/2013 | Zu et al. | |
| 8,618,013 B2 | 12/2013 | Finley | |
| 8,637,169 B2 | 1/2014 | Van Nutt et al. | |
| 8,653,419 B2* | 2/2014 | Weiss .................. | H05B 3/84 219/203 |
| 8,988,757 B2 | 3/2015 | Weidner | |
| 9,140,832 B2 | 9/2015 | Medwick et al. | |
| 9,300,036 B2 | 3/2016 | Misra et al. | |

(Continued)

FOREIGN PATENT DOCUMENTS

| | | |
|---|---|---|
| CN | 101610948 A | 12/2009 |
| CN | 102311729 A | 12/2009 |

(Continued)

OTHER PUBLICATIONS

Jeong, Jin-A., et al., "Ag grid/ITO hybrid transparent electrodes prepared by inkjet printing," Solar Energy Materials & Solar Cells, 2011, 95, pp. 1974-1978.

Database WPI; Thomson Scientific; XP-002690188; C:\EPOPROGS\SEA\. \. \.. \epodata\sea\eplogf\internal.log; Jan. 21, 2013; 2 pages.

Huang, et al., "Graphene-Based Conducting Inks for Direct Inkjet Printing of Flexible Conductive Patterns and Their applications in Electric Circuits and Chemical Sensors," Nano Research, 4(7), 2011, pp. 675-684.

http://www.novacentrix.com/product/metalon.php, "Metalon® Conductive Inks," 2010, 1 page.

http://www-static.methode.com/static/cms_workspace/pdf/Sensors%20&%20Switches/Methode-Nano-Inks.pdf, "Nano-Silver and Nano-Carbon Inks," 3 pages.

(Continued)

*Primary Examiner* — Seth Dumbris
(74) *Attorney, Agent, or Firm* — LEWIS ROCA ROTHGERBER CHRISTIE LLP

(57) ABSTRACT

A coating includes a continuous, transparent, and electrically conductive layer having a transmittance of visible light of 40% or higher, and a plurality of electrically conductive lines directly on at least a portion of the continuous, transparent, and electrically conductive layer, the electrically conductive lines having a thickness of 50 nm to 50 μm. A coated substrate includes a substrate, and the coating on at least a portion of the substrate.

17 Claims, No Drawings

(56) References Cited

U.S. PATENT DOCUMENTS

| | | | |
|---|---|---|---|
| 9,320,136 | B2 | 4/2016 | Frey et al. |
| 2003/0013048 | A1 | 1/2003 | Gilson |
| 2003/0121272 | A1 | 7/2003 | Kim et al. |
| 2003/0124259 | A1 | 7/2003 | Kodas et al. |
| 2003/0127445 | A1 | 7/2003 | Oguma et al. |
| 2003/0136572 | A1 | 7/2003 | Arakawa et al. |
| 2003/0211246 | A1 | 11/2003 | Kydd et al. |
| 2004/0112175 | A1 | 6/2004 | Ishihara et al. |
| 2004/0265550 | A1 | 12/2004 | Glatkowski et al. |
| 2005/0095410 | A1 | 5/2005 | Mazurkiewicz |
| 2005/0111070 | A1 | 5/2005 | Lin et al. |
| 2006/0038478 | A1 | 2/2006 | Moon et al. |
| 2006/0048963 | A1 | 3/2006 | Nishinaka et al. |
| 2006/0097650 | A1 | 5/2006 | Kim |
| 2006/0099403 | A1 | 5/2006 | Johnson |
| 2006/0121271 | A1 | 6/2006 | Frey et al. |
| 2006/0137856 | A1 | 6/2006 | Popovich |
| 2006/0154092 | A1 | 7/2006 | Naito et al. |
| 2006/0183342 | A1 | 8/2006 | Bruyns et al. |
| 2006/0186104 | A1 | 8/2006 | Winter |
| 2006/0200965 | A1 | 9/2006 | Farooq et al. |
| 2007/0018576 | A1 | 1/2007 | Park |
| 2007/0128905 | A1 | 6/2007 | Speakman |
| 2007/0201122 | A1 | 8/2007 | Dozeman et al. |
| 2008/0013299 | A1 | 1/2008 | Renn |
| 2008/0042012 | A1 | 2/2008 | Callahan et al. |
| 2008/0047747 | A1 | 2/2008 | Aoyama et al. |
| 2008/0057233 | A1 | 3/2008 | Harrison et al. |
| 2008/0143913 | A1 | 6/2008 | Lee et al. |
| 2008/0144159 | A1 | 6/2008 | Nerden |
| 2008/0150148 | A1 | 6/2008 | Frey et al. |
| 2008/0197773 | A1 | 8/2008 | Cha et al. |
| 2008/0204970 | A1 | 8/2008 | Ocola et al. |
| 2008/0230173 | A1 | 9/2008 | Cho et al. |
| 2008/0302981 | A1 | 12/2008 | Matsumura et al. |
| 2009/0020215 | A1 | 1/2009 | Hood et al. |
| 2009/0145654 | A1 | 6/2009 | Cha et al. |
| 2009/0205879 | A1 | 8/2009 | Halsey et al. |
| 2009/0280329 | A1 | 11/2009 | Rukavina et al. |
| 2009/0316417 | A1 | 12/2009 | Chari et al. |
| 2010/0025533 | A1 | 2/2010 | Bimanand et al. |
| 2010/0028564 | A1 | 2/2010 | Cheng et al. |
| 2010/0046191 | A1 | 2/2010 | Den Boer et al. |
| 2010/0116527 | A1 | 5/2010 | Khosla et al. |
| 2010/0140673 | A1 | 6/2010 | Daniel et al. |
| 2010/0164354 | A1 | 7/2010 | Lim et al. |
| 2010/0164358 | A1 | 7/2010 | Lee et al. |
| 2010/0300729 | A1 | 12/2010 | Matsuda et al. |
| 2010/0301320 | A1 | 12/2010 | Rand et al. |
| 2010/0304069 | A1 | 12/2010 | Oguri et al. |
| 2010/0315105 | A1 | 12/2010 | Fornes |
| 2010/0328248 | A1* | 12/2010 | Mozdzyn ............... G06F 3/0445 345/174 |
| 2011/0020448 | A1 | 1/2011 | Park et al. |
| 2011/0032622 | A1 | 2/2011 | Kim et al. |
| 2011/0070448 | A1 | 3/2011 | Matsumura et al. |
| 2011/0088931 | A1 | 4/2011 | Lettow et al. |
| 2011/0310489 | A1 | 12/2011 | Kajiya et al. |
| 2012/0048612 | A1 | 3/2012 | Bunyan et al. |
| 2012/0103669 | A1* | 5/2012 | Pruneri ................ H01L 51/445 174/250 |
| 2012/0194441 | A1 | 8/2012 | Frey et al. |
| 2012/0328859 | A1 | 12/2012 | Uprety et al. |
| 2013/0182405 | A1 | 7/2013 | Kaufman |
| 2013/0228365 | A1 | 9/2013 | Uprety et al. |
| 2014/0251662 | A1 | 9/2014 | Rotto et al. |
| 2015/0096969 | A1* | 4/2015 | Uprety ..................... H05B 3/86 219/203 |
| 2015/0373831 | A1 | 12/2015 | Rogers et al. |
| 2016/0120039 | A1 | 4/2016 | Bang et al. |
| 2017/0150659 | A1* | 5/2017 | Uprety ................... C03C 17/36 |

FOREIGN PATENT DOCUMENTS

| | | |
|---|---|---|
| JP | 2000-311527 A | 11/2000 |
| JP | 2008-117656 | 5/2008 |
| JP | 2008-201206 | 9/2008 |
| TW | 201139135 A1 | 11/2011 |
| WO | 2010/144770 A1 | 12/2010 |

OTHER PUBLICATIONS http://vendor.parker.com/Groups/Seal/Divisions/Chomerics/Chomerics%20Product%20Library.hsf/5b3d26c6b2630956852573da0065b80c/80939478572e2c07852574260067990c/$FILE/E%20-%20Windows.pdf,"Design Guidelines to EMI Shielding Windows," pages E1-E24.

Jacoby, Keith T., et al., "Predicted and measured EMI shielding effectiveness of a metallic mesh coating on a sapphire window over a broad frequency range," 11 pages.

Griggs, Charles, et al., "Opportunities for Inkjet Printing in Industrial Applications," Industrial + Specialty Printing, May/Jun. 2010, 4 pages.

Niklasson, Gunnar A., et al., "Electrochromics for smart windows: thin films of tungsten oxide and nickel oxide, and devices based on these," Journal of Materials Chemistry, 17, 2007, pp. 127-156.

B. L. Butler et al., Solar Reflectance, Transmittance and Absorptance of Common Materials, Presented At The Solar Industrial Process Heat Conference, Oakland Hyatt House, Oakland, California, Oct. 31-Nov. 2, 1979, 10 pgs.

M.G. Faraj et al., PET as a plastic substrate for the flexible optoelectronic applications, Optoelectronics and Advanced Materials—Rapid Communications, vol. 5, No. 8, Aug. 2011, pp. 879-882.

Christopher Wargo, Characterization of Conductors for Printed Electronics, PChem Associates, 3599 Marshall Lane, Bensalem, PA 19020, (215)244-4603, www.nanopchem.com, 12 pgs.

* cited by examiner

COATING INCLUDING ELECTRICALLY CONDUCTIVE LINES DIRECTLY ON ELECTRICALLY CONDUCTIVE LAYER

CROSS-REFERENCE TO RELATED APPLICATION

The present application claims priority to and the benefit of U.S. Provisional Application No. 62/777,790, filed on Dec. 11, 2018, in the U.S. Patent and Trademark Office and titled "COATING INCLUDING ELECTRICALLY CONDUCTIVE LINES DIRECTLY ON ELECTRICALLY CONDUCTIVE LAYER," the entire content of which is incorporated herein by reference.

FIELD

The present disclosure relates to a coating including a continuous, transparent, and electrically conductive layer and a plurality of electrically conductive lines directly on at least a portion of the continuous, transparent, and electrically conductive layer. Additionally, the disclosure relates to a coated substrate including the coating, a transparency including the coated substrate, a vehicle including the transparency, and methods of forming the coating.

BACKGROUND

Transparent coatings may be used on transparencies in a variety of applications. For example, transparent, conductive coatings may be used to provide electromagnetic interference (EMI) shielding (and radar attenuation) in vehicle transparencies. In stealth aircraft applications, such coatings applied over deep draw bubble canopies may provide EMI shielding at frequencies in the C band range of 4 to 8 gigahertz (GHz), the X band range of 8 to 12 GHz, the K band range of 18 to 27 GHz, and some portions (e.g., the higher frequency portions) of the S band range of 2 to 4 GHz. Previous coatings, however, do not provide EMI shielding (and radar attenuation) suitable for stealth applications at lower frequencies such as those in the very high frequency (VHF) range of 30 to 300 megahertz (MHz), portions of the ultra high frequency (UHF) range of 300 MHz to 3 GHz, and/or portions of the L band range of 1 to 2 GHz. Additionally, advances in computational power are being used to develop low-frequency radar systems that operate in the VHF, UHF, and/or L bands in order to track stealth vehicles with greater precision.

SUMMARY

The present disclosure provides a coating that includes a continuous, transparent, and electrically conductive layer having a transmittance of visible light of 40% or higher, and a plurality of electrically conductive lines directly on at least a portion of the continuous, transparent, and electrically conductive layer, the electrically conductive lines having a thickness of 50 nm to 50 μm.

DETAILED DESCRIPTION

The present disclosure relates to a coating including a continuous, transparent, and electrically conductive layer having a transmittance of visible light of 40% or higher; and a plurality of electrically conductive lines directly on at least a portion of the continuous, transparent, and electrically conductive layer, the electrically conductive lines having a thickness of 50 nm to 50 μm. For example, the plurality of electrically conductive lines may be directly on at least a portion of a main surface of the continuous, transparent, and electrically conductive layer. As used herein, the term "directly on" means that a first feature described as being "directly on" a second feature physically contacts the second feature without any intervening features between the first and second features. For example, as described herein, at least a portion, such as all, of the plurality of electrically conductive lines may physically contact the continuous, transparent, and electrically conductive layer such that there are no or substantially no intervening elements between the portion of the plurality of electrically conductive lines and the continuous, transparent, and electrically conductive layer, noting that impurities and/or residual materials associated with the process of forming the coating may still remain between the portion of the plurality of electrically conductive lines and the continuous, transparent, and electrically conductive layer. The plurality of electrically conductive lines may directly contact the continuous, transparent, and electrically conductive layer at spaces between particles (e.g., spaces between particles of a silane coupling agent) and still be considered "directly on" the continuous, transparent, and electrically conductive layer. As described herein, the term "continuous" as it relates to the continuous, transparent, and electrically conductive layer, refers to a layer that is unbroken or uninterrupted such that the layer is electrically conductive and can conduct an electric current from an end of the layer to another end of the layer. As described herein, the term "electrically conductive" as it relates to the continuous, transparent, and electrically conductive layer, refers to a layer that allows electrons to flow through the material and has a sheet resistance of greater than 0.0001 ohms per square (Ω/□), for example, a sheet resistance of greater than 0.01 Ω/□. For example, the continuous, transparent, and electrically conductive layer may have a sheet resistance in a range of 0.1 to 5.0 Ω/□, 0.1 to 2.0 Ω/□, 0.1 to 1.5 Ω/□, 0.1 to 1.3 Ω/□, 0.1 to 0.30 Ω/□, 0.1 to 0.25 Ω/□, 0.1 to 0.20 Ω/□, or, for example, 0.25 to 0.30 Ω/□. As described herein, the term "transparent" as it relates to the continuous, transparent, and electrically conductive layer, refers to a layer that has a visible light transmittance of 40% or higher (e.g., 40% to 100%). As described herein, the term "visible light" refers to light in a wavelength range of 390 nm to 700 nm. For example, as described herein, a transmittance of visible light of 40% or higher, refers to a transmittance of 40% to 100% of light having a wavelength in a range of 390 nm to 700 nm through the article having the referenced transmittance. The continuous, transparent, and electrically conductive layer may cover a portion of an underlying layer or article and still be "continuous." The coating may provide electromagnetic interference (EMI) shielding of less than or equal to 100 dB (e.g., 20 dB to 100 dB, 30 dB to 100 dB, 40 dB to 100 dB, 50 dB to 100 dB, 60 dB to 100 dB, 70 dB to 100 dB, 80 dB to 100 dB, or 90 dB to 100 dB) across a frequency range of 1 kHz to 50 GHz. For example, the coating may provide EMI shielding (and radar attenuation) across relatively lower frequencies such as, for example, the very high frequency (VHF) range of 30 to 300 megahertz (MHz), the ultra high frequency (UHF) range of 300 MHz to 3 gigahertz (GHz), and/or the L band range of 1 to 2 GHz. The EMI shielding provided by the coating may shield electronic systems within a vehicle including the coating from electromagnetic interference and may also prevent or reduce the buildup of static charge on the vehicle. The coating may be included in a grid hybrid transparent conductive coating system.

The present disclosure is further directed to a transparency including a substrate to which is applied, at least in part, the coating including the continuous, transparent, and electrically conductive layer having a transmittance of visible light of 40% or higher; and the plurality of electrically conductive lines directly on at least the portion of the continuous, transparent, and electrically conductive layer. As used herein, the term "transparency" may refer to an article having a visible light transmittance of 40% or higher such that an object on a first side of the article is at least partially visible through the article from a second side of the article that is opposite to the first side. A transparency of the present disclosure may be used in any suitable vehicle such as, for example, a flying vehicle (e.g., an airplane, a helicopter, a rocket, or any other suitable aircraft or spacecraft). For example, the transparency may be in a window, windshield, or canopy of a vehicle (e.g., a flying vehicle). As used herein, the term "vehicle" is used in its broadest sense and includes all types of ground and aerospace vehicles. For example, the vehicle may include, but is not limited to airplanes (e.g., large commercial passenger, freight, and military airplanes), helicopters (e.g., commercial and military helicopters), rockets and other spacecraft, animal trailers (e.g., horse trailers), cars, trucks, buses, vans, heavy duty equipment, golf carts, motorcycles, bicycles, railroad cars and the like, but the present disclosure is not limited thereto. The transparency may be an armor-grade transparency. For example, the transparency may be used as an armor-grade windshield or windows of an AM General HMMWV ("HUMVEE").

The electrically conductive lines may have spaces (or apertures) therebetween that allow light to pass between or around the electrically conductive lines. Without being limited to any particular mechanism or theory, the electrically conductive lines may be made relatively thicker than the continuous, transparent, and electrically conductive layer and still have suitable visible light transmittance, because visible light is able to pass between the electrically conductive lines rather than being limited to passing through the electrically conductive lines, while the continuous, transparent, and electrically conductive layer does not include spaces or apertures in a single layer through which light can pass, and therefore, light transmitted through the continuous, transparent, and electrically conductive layer passes through, rather than around, the continuous, transparent, and electrically conductive layer. For example, because there are spaces or apertures between the electrically conductive lines, light can pass between or around the electrically conductive lines by passing through the spaces or apertures, while the continuous, transparent, and electrically conductive layer does not include spaces or apertures through which the light can pass. Making the electrically conductive lines thicker than the continuous, transparent, and electrically conductive layer decreases the sheet resistance of the electrically conductive lines, thereby increasing the EMI shielding provided by the electrically conductive lines at lower frequencies. As used herein, the term "sheet resistance" refers to the electrical resistance of a thin film that is substantially uniform in thickness. The sheet resistance may also be referred to herein as sheet resistivity, surface resistance, or surface resistivity. Increasing the line widths of the electrically conductive lines and/or reducing the spacing between the electrically conductive lines also increases the shielding, but these changes also reduce the visible light and night vision (NVIS) light transmittance. Accordingly, the electrically conductive lines may provide high visible light transmittance and NVIS light transmittance (e.g., 40% or higher, 50% or higher, 60% or higher, 80% or higher, 90% or higher, 40% to 100%, 50% to 100%, 60% to 100%, 70% to 100%, 80% to 100%, or 90% to 100%) while also providing EMI shielding (e.g., high microwave and radio frequency (RF) shielding) such as, for example, EMI shielding of 20 dB to 100 dB across a frequency range of 1 kHz to 50 GHz. As described herein, the term "night vision (NVIS)" refers to light having a wavelength in a range of 600 nm to 1,000 nm (e.g., 630 nm to 960 nm). The EMI shielding may be measured by using a network analyzer tool according to ASTM D4395-10 or IEEE Std. 299-1997.

By having a relatively larger thickness than the continuous, transparent, and electrically conductive layer, the plurality of electrically conductive lines may be made to have a lower sheet resistance (e.g., a sheet resistance in a range of 0.1 ohms per square ($\Omega/\square$) or less (e.g., a sheet resistance of 0.0001 to 0.5 $\Omega/\square$, 0.0001 to 0.4 $\Omega/\square$, 0.0001 to 0.3 $\Omega/\square$, 0.0001 to 0.2 $\Omega/\square$, or 0.0001 to 0.1 $\Omega/\square$) than the continuous, transparent, and electrically conductive layer, and thereby the electrically conductive lines may provide EMI shielding at frequencies relatively lower than those of the continuous, transparent, and electrically conductive layer. The sheet resistance may be measured using a four-point probe or bus bars (e.g., high conductivity bus bars). The sheet resistance of the plurality of electrically conductive lines may be measured separately from the continuous, transparent, and electrically conductive layer by forming the plurality of electrically conductive lines on a substrate (e.g., a glass substrate), without the continuous, transparent, and electrically conductive layer, and measuring the sheet resistance of the plurality of electrically conductive lines using a four-point probe (for the continuous, transparent, and electrically conductive layer) or bus bars (e.g., high conductivity bus bars for the plurality of the electrically conductive lines). The sheet resistance of the continuous, transparent, and electrically conductive layer may be measured separately from the plurality of electrically conductive lines by forming the continuous, transparent, and electrically conductive layer on a substrate (e.g., a glass substrate), without the plurality of electrically conductive lines, and measuring the sheet resistance of the continuous, transparent, and electrically conductive layer using a four-point probe.

Accordingly, the electrically conductive lines may be thicker than the continuous, transparent, and electrically conductive layer in a direction substantially perpendicular to the plane along which the electrically conductive lines and/or continuous, transparent, and electrically conductive layer extend, but the present disclosure is not limited thereto. For example, the electrically conductive lines may have a thickness (e.g., a height above the surface on which the electrically conductive lines are located) in a range of 50 nm to 50 $\mu$m (e.g., 50 nm to 25 $\mu$m, 50 nm to 15 $\mu$m, or 50 nm to 5 $\mu$m). The thickness and/or width of the electrically conductive lines may be varied to vary the EMI shielding, de-icing and/or defogging properties of the coating.

The continuous, transparent, and electrically conductive layer may have a thickness in a range of 10 nm to 5 $\mu$m (e.g., 100 nm to 4 $\mu$m, 300 nm to 3 $\mu$m, 400 nm to 2$\mu$m, or 500 nm to 1 $\mu$m). If the continuous, transparent, and electrically conductive layer is too thick, the visible light transmittance of the continuous, transparent, and electrically conductive layer will be unsuitably low.

By including the plurality of electrically conductive lines directly on at least a portion of the continuous, transparent, and electrically conductive layer, the coating may provide EMI shielding across a wide range of frequencies, including relatively lower frequencies. For example, the coating may provide electromagnetic interference (EMI) shielding of 20 dB to 100 dB (e.g., 20 dB to 95 dB, 20 dB to 85 dB, 40 to 100 dB, 40 dB to 95 dB, 40 dB to 85 dB, 60 dB to 95 dB, 60 dB to 85 dB, 70 dB to 100 dB, or 70 dB to 85 dB) across a frequency range of 1 kHz to 50 GHz (e.g., 30 MHz to 40 GHz), across a frequency range of 1 MHz to 50 GHz (e.g., 30 MHz to 40 GHz), across a frequency range of 1 kHz to 40 GHz (e.g., 30 MHz to 40 GHz), across a frequency range of 1 MHz to 40 GHz (e.g., 100 MHz to 40 GHz), or across any other frequency range subsumed therein.

The continuous, transparent, and electrically conductive layer may provide EMI shielding of 20 to 45 dB (e.g., 25 dB to 45 dB, 30 dB to 45 dB, 35 dB to 45 dB, or 40 dB to 45 dB) across a frequency range of 1 GHz to 50 GHz (e.g., 1 GHz to 50 GHz) or any other frequency range subsumed therein, while the electrically conductive lines, or a mesh formed from the electrically conductive lines, may provide EMI shielding of 45 dB to 100 dB (e.g., 45 dB to 85 dB, 55 dB to 100 dB, 55 dB to 95 dB, 55 dB to 85 dB, 65 dB to 100 dB, 65 dB to 85 dB, 75 dB to 100 dB, or 75 dB to 85 dB) across a frequency range of 1 kHz to 1 GHz (e.g., 30 MHz to 1 GHz), or any other frequency range subsumed therein. The EMI shielding of the plurality of electrically conductive lines may be measured separately from the continuous, transparent, and electrically conductive layer by forming the plurality of electrically conductive lines on a substrate (e.g., a glass substrate), without the continuous, transparent, and electrically conductive layer, and measuring the EMI shielding of the plurality of electrically conductive lines according to ASTM D4395-10 or IEEE Std. 299-1997. The EMI shielding of the continuous, transparent, and electrically conductive layer may be measured separately from the plurality of electrically conductive lines by forming the continuous, transparent, and electrically conductive layer on a substrate (e.g., a glass substrate), without the plurality of electrically conductive lines, and measuring the EMI shielding of the continuous, transparent, and electrically conductive layer according to ASTM D4395-10 or IEEE Std. 299-1997. The EMI shielding performance of the coating is improved by having the electrically conductive lines directly on at least a portion of the continuous, transparent, and electrically conductive layer without any intervening layers or features between the electrically conductive lines and the continuous, transparent, and electrically conductive layer.

As used herein, the term "continuous, transparent, and electrically conductive layer" refers to a layer that is continuous (e.g., does not have any holes or apertures between its edges such as, for example, a layer that is unbroken between its edges), transparent (e.g., has a transmittance of visible light of 40% or higher), and is electrically conductive (e.g., has a sheet resistance of 5 ohms per sq or less, or 1 ohm per sq or less). The transmittance of visible light through the continuous, transparent, and electrically conductive layer may be measured according to ASTM D1003 using, for example, a Haze-Gard Plus instrument, and may be measured with or without the electrically conductive lines on the continuous, transparent, and electrically conductive layer. The transmittance of visible light through the continuous, transparent, and electrically conductive layer may be 40% or higher. For example, the continuous, transparent, and electrically conductive film may be a continuous film having 100% coating surface coverage (such as an indium tin oxide coating) and/or may be a single (or sole) layer or may include a plurality of layers (e.g., may include a bi-layer).

The continuous, transparent, and electrically conductive layer may include any suitable material for example, a transparent metal oxide layer, a transparent metal layer, or a combination thereof. Non-limiting examples of the transparent metal oxide layer may include indium tin oxide (ITO), aluminum zinc oxide (AZO), antimony doped tin oxide (ATO), tin oxide (TO), fluorine doped tin oxide (FTO), and combinations thereof. As used herein, the terms "combination thereof" and "combinations thereof" may refer to a chemical combination (e.g., an alloy or chemical compound), a mixture, or a laminated structure of components. Non-limiting examples of the transparent metal layer may include gold (Au), silver (Ag), platinum (PT), and palladium (Pd), copper (Cu), aluminum (Al), nickel (Ni), chromium (Cr), and combinations thereof. The transparent metal layer may be sandwiched between dielectric layers such as, for example, aluminum doped zinc oxide (AZO), titanium oxide ($TiO_2$), indium tin oxide (ITO), and hafnium (Hf), or combinations thereof. The dielectric layers may improve the visible light transmittance of the coating and/or the transparent metal layer.

The visible light transmittance (VLT), compatibility with night vision imaging systems (NVIS), and EMI shielding performance of the electrically conductive lines are affected by the arrangement and/or geometry of the electrically conductive lines. For example, when the electrically conductive lines are arranged as a mesh, the total visible light and/or NVIS light transmittance of the mesh may be equal to the percent open area of the mesh. The electrically conductive lines may be arranged in any suitable manner on the continuous, transparent, and electrically conductive layer. For example, the electrically conductive lines may be arranged as an electrically conductive mesh. The electrically conductive mesh may have a sheet resistance of 1.0 ohms per square ($\Omega/\square$) or less (e.g., a sheet resistance of 0.5 $\Omega/\square$ or less, 0.1 $\Omega/\square$ or less, or 0.0001 to 0.1 $\Omega/\square$). The electrically conductive lines may include any suitable material. For example, the electrically conductive lines may include gold (Au), copper (Cu), silver (Ag), nickel (Ni), chromium (Cr), aluminum (Al), platinum (Pt), palladium (Pd), or a combination thereof. The plurality of electrically conductive lines may further include epoxy, or any other material having suitable binding properties.

The electrically conductive lines may be arranged as an array of apertures (e.g., a tessellation). The electrically conductive lines may be arranged in any suitable manner to reduce Fraunhofer diffraction. For example, the electrically conductive lines may define apertures (e.g., an array of apertures) defined by respective modified polygons having a plurality of curved sides, such that visible light from a point source of light that passes through the conductive mesh is diffracted by the curved sides of the apertures over a plurality of diverging, fan-like areas, thereby reducing the distraction of a viewer (e.g., a pilot) viewing the light through a transparency including the coating. The electrically conductive lines are not limited thereto, however, and may instead define apertures having any suitable shape. The arrangement of the electrically conductive lines, however, is not limited. For example, the plurality of electrically conductive lines may be arranged in any form of pattern or tessellation, including, but not limited to, a square grid, triangular tiling, hexagonal tiling, or grid formed from straight, undulating, sinusoidal or zigzag lines. The electrically conductive lines may be arranged in any form of uniform, non-uniform, repeating or random pattern. For example, the electrically conductive lines may define apertures having a plurality of shapes selected from, for example, circles, hexagons, pentagons, and combinations thereof. A set of the electrically conductive lines may form (e.g., define) at least one aperture having a circular shape, at least one aperture having a hexagonal shape, at least one aperture, having a pentagonal shape, at least one aperture having a diamond shape, or a combination thereof. At least one of the apertures may have three-fold symmetry. For example, at least one of the apertures may have a trefoil shape. At least one of the apertures may have C3 symmetry, with the proviso that the at least one aperture does not have symmetry higher than C3 symmetry, but the present disclosure is not limited thereto. As used herein, the term "C3 symmetry" may have the same meaning as commonly understood for point groups in the field of geometry. For example, the term "C3 symmetry" may refer to 3-fold symmetry such that the appearance of the at least one aperture does not change after a rotation of the at least one aperture by 120° around a set point in a two dimensional plane.

The electrically conductive lines may be sawtoothed (e.g., wavy) and have an aperture shape as described herein (e.g., at least one aperture having a hexagonal shape formed of (e.g., defined by) wavy lines). For example, at least one of the electrically conductive lines may have undulations such as, for example, undulations having a repeating pattern that is generally regularly spaced. At least one of the electrically conductive lines may have undulations including a plurality of peaks and troughs such that a distance between two adjacent peaks and/or a distance between two adjacent troughs is no more than 30 µm (e.g., no more than 29, 28, 27, 26, 25, 24, 23, 22, 21, 20, 19, 18, 17, 16, 15, 14, 13, 12, 11, 10, 9, 8, 7, 6, 5, 4, 3, 2, or 1 µm). The two adjacent troughs may be the same as or different from the distance between the two adjacent peaks, but the present disclosure is not limited thereto.

The electrically conductive lines may define an aperture having a shape of a polygon (e.g., a regular polygon such as, for example, a triangle quadrilateral, pentagon, hexagon, heptagon, octagon, nonagon, decagon, hendecagon, dodecagon, and the like) having at least one curved side having a radius of curvature of no more than 500 µm. For example, the curved side may have a radius of curvature of no more than 450, 400, 399, 350, 349, 300, 299, 250, 249, 200, 199, 150, 149, 100, 99, or no more than 50 µm, or any range subsumed therein. The curved side may have a shape of a semicircle (e.g., of approximately a semicircle). The electrically conductive lines may define an aperture having a shape of a polygon in which each of the straight sides of the polygon has been replaced by a curved line having substantially a single curvature. For example, the electrically conductive lines may define an aperture having a shape of a polygon having 3, 4, 5, 6, 7, 8, 9, 10, 11, 12, 13, 14, 15, 16, or 18 straight sides, in which each of the straight sides of the polygon has been replaced by a curved line having substantially a single curvature. The electrically conductive lines that define the polygon may have any suitable width such as, for example, a width of no more than 500 µm (e.g., no more than 50 µm, 0.001 µm to 50 µm, 0.001 µm to no more than 15 µm, or any range subsumed therein), but the present disclosure is not limited thereto. The electrically conductive lines define an array of apertures having a shape of a polygon in which each of the straight sides of the polygon has been replaced by a curved line having substantially a single curvature, and in which the intersection of a curved line one of the polygons with a curved line of another one of the polygons has a rounded shape. For examples, the polygons may include one or more depressions for receiving a projection of an adjacent polygon. An intersection of a projection and a depression of a polygon may have a rounded shape.

The electrically conductive lines may have a width (e.g., a width substantially parallel to the substrate along the longest dimension of the substrate) of no more than 50 µm (e.g., no more than 1, 2, 3, 4, 5, 6, 7, 8, 9, 10, 11, 12, 13, 14, 15, 19, 20, 24, 25, 29, 30, 34, 35, 39, 40, 44, 45, or 49 µm, or any range subsumed therein), but the electrically conductive lines are not limited thereto. For example, each of the electrically conductive lines may independently have a width in a range of 0.5 µm to 50 µm (or in any range subsumed therein such as, for example, a width in a range of 0.5 µm to 15 µm or 1 µm to 15 µm). Additionally, spaces (e.g., distances) between adjacent electrically conductive lines may each have a width (or pitch) of no more than 1 mm, 900 µm, 800 µm, 700 µm, 600 µm, 500 µm, 400 µm, 300 µm, 275 µm, 250 µm, 200 µm, 2,500 µm, or 5,000 µm but the spaces are not limited thereto. For example, a distance between two adjacent of the electrically conductive lines (a pitch) may be no more than 1 mm, 900 µm, 800 µm, 700 µm, 600 µm, 500 µm, 400 µm, 300 µm, 275 µm, 250 µm, 200 µm, 2,500 µm, or 5,000 µm but the distances are not limited thereto. The transparency may include at least one electrically conductive line having a width of no more than 50 µm (e.g., no more than 15 µm) to reduce distraction resulting from optical diffraction of light transmitted through or reflected by the transparency as compared to a transparency including electrically conductive lines having a width greater than 50 µm (or greater than 15 µm), a distance between two of the electrically conductive lines greater than 1 mm, and/or an unsuitable shape defined by the electrically conductive lines.

Non-limiting examples of the electrically lines are commercially available as a conductive mesh that may be obtained from CIMA Nanotech, Inc., Dontech, Inc., Applied Nanotech Holdings, Inc., NanoMas Technologies, Inc., and FUJIFILM Dimatix, Inc. The electrically conductive lines may be formed by any suitable method available in the art. For example, the plurality of electrically conductive lines may be deposited directly on a substrate utilizing an aerosol jet process (available from Optomec, Albuquerque, N. Mex.), inkjet printing, or lithography (e.g., photolithography). Example electrically conductive lines may be prepared by inkjet printing conductive inks, such as the METALON conductive inks available from Novacentrix.

The transparency may include any suitable additional layers available in the art in addition to the coating of the present disclosure. For example, the coated substrate or transparency comprising the same may include an overlayer on at least a portion of the electrically conductive lines and/or the continuous, transparent, and electrically conductive layer to protect the transparency. An interlayer may also be used to bond or attach the overlayer (e.g., stretched acrylic) to the electrically conductive lines and/or the continuous, transparent, and electrically conductive layer. The overlayer, if used, will typically be durable and able to resist scratching or other forms of physical damage. The overlayer should also resist damage from weather or other forms of chemical attack. The overlayer may include any suitable organic resin, such as polyacrylate (e.g., stretched acrylic), polycarbonate (e.g., bisphenol A polycarbonate), or polyurethane, glass, or any other material having suitable transmissive and protective properties. The polyacrylate may be a stretched acrylic including cross-linked polymethylmethacrylate (PMMA) materials. Any suitable stretched acrylic available in the art may be utilized for the overlayer. The stretched acrylic may be formed by placing a cast billet (e.g., a cast billet of PMMA) in a biaxial stretching tool. For example, the cast billet may have a size of 6'×6', but the cast billet is not limited thereto. The substrate (the cast billet) is then heated above the Tg of the material of the cast billet and the substrate is stretched biaxially at a finite rate (any suitable rate utilized in the art may be utilized). The stretching improves the craze resistance, crack propagation and mechanical strength of the acrylic. The polyurethane of the overlayer may include OPTICOR, which may be obtained from PPG Industries Inc. The overlayer may have a thickness in a range of 0.1 to 0.75 inches.

In addition to providing EMI shielding capabilities, the coating of the present disclosure may be configured to de-ice or defog the transparency by, among other things, heating the transparency (e.g., a window, windshield, and/or canopy) including the coating by flowing an electric current through a conductive portion of the coating. As used herein, the term "defogging" may refer to a process that reduces an amount of condensation on a transparency, and the term "de-icing" may refer to a process that reduces an amount of ice on a transparency. For example, an electric current may be flowed through at least a portion of the electrically conductive lines and/or at least a portion of the continuous, transparent, and electrically conductive layer thereby heating the transparency and preventing or reducing the formation of condensation or ice, or evaporating or melting the condensation or ice that has already formed, on the transparency.

The de-icing and/or defogging capabilities of an example transparency may be tailored to the particular application. Generally, an aircraft cockpit windshield requires greater de-icing capabilities than does an aircraft cockpit side window and, consequently, the aircraft cockpit windshield typically has a greater number of watts per square inch applied to it (e.g., 4 to 5 W/in. sq.) than does the aircraft cockpit side window (e.g., 1 to 2 W/in. sq.). As such, the de-icing and/or defogging capabilities of the transparency may be tailored to a particular application by appropriately selecting the sheet resistivity of the conductive mesh. Additionally, the transparency may include an electrical connection, such as bus bars, to accomplish the de-icing or defogging.

The transparencies of the present disclosure may include smart windows or switchable windows that have variable light transmission properties. For example, the transparencies of the present disclosure may include electrochromic devices, suspended particle devices, and liquid crystal devices. The above-described electrically conductive lines and/or continuous, transparent, and electrically conductive layer may be used as a transparent electrode in any of the afore-mentioned devices. As a transparent electrode, the electrically conductive lines and/or continuous, transparent, and electrically conductive layer may provide an electrical signal to cause a change in the transparency and/or color of the device by causing a change in the electrochromic material, suspended particles, polymer, or liquid crystals of the transmittance controlling layer. The device may include any suitable electrochromic material, such as electrochromic polymers (e.g., polyaniline), viologens, polyoxotungstates, tungsten oxide, nickel oxide, and/or tungsten dioxide.

The present disclosure also relates to sensors, for example, temperature sensors (e.g., microsensors), crack detectors, arc detectors, strain gauges, and moisture sensors, and any other suitable sensors. The sensor may include the electrically conductive lines and/or continuous, transparent, and electrically conductive layer as an electrode of the sensor. For example, the transparency may include a heater film and a temperature sensor. The heater film may include any suitable material available in the art for heater films, and may be formed according to any suitable method available in the art. For example, the heater film may include an indium tin oxide (ITO) layer. The heater film may include any of the electrically conductive lines described herein, and may be formed according to any of the methods described herein. The sensor may include the electrically conductive lines and/or continuous, transparent, and electrically conductive layer described herein, and may be formed according to any of the methods described herein.

In operation, as the temperature of the sensor increases (e.g., as a result of heat from the heater film), the resistance of the sensor (e.g., the electrically conductive lines and/or continuous, transparent, and electrically conductive layer) increases. This increase in resistance may be detected by a temperature controller coupled to the sensor. The temperature controller may control the temperature of the heater film. The temperature of the heater film may be more accurately monitored and controlled by utilizing the sensor, as compared to other sensors that are not formed according to the present disclosure, thereby improving the durability of the heater film and/or the transparency.

The transparency may further include a dielectric layer between the sensor (e.g., the electrically conductive lines and/or continuous, transparent, and electrically conductive layer) and the heater film (e.g., the electrically conductive lines and/or continuous, transparent, and electrically conductive layer). The dielectric layer may include any suitable dielectric material available in the art. The dielectric layer may be formed using any suitable method available in the art, and/or using any of the methods described herein (e.g., inkjet printing, aerosol jet processes, lithography, and/or the like). For example, the dielectric layer may include titanium oxide (e.g., $TiO_2$), aluminum oxide (e.g., $Al_2O_3$), dielectric aluminum zinc oxide (e.g., AZO), aluminum nitride (e.g., AlN), aluminum carbide (e.g., $Al_4C_3$), fused silica (e.g., $SiO_2$), magnesium oxide (e.g., MgO), indium tin oxide (e.g., ITO), boron nitride (e.g., BN), silicon carbide (e.g., CSi or SiC), zirconium dioxide (e.g., $ZrO_2$), diamond like carbon (e.g., DLC), hafnium oxide (e.g., $HfO_2$), and/or any other suitable metal oxide. The dielectric layer may be directly on the heater film (e.g., the dielectric layer may physically contact the heater film) and the sensor may be directly on the dielectric layer (e.g., the sensor may physically contact the dielectric layer).

A tiecoat may be on the sensor and the heater film. The tiecoat may physically contact both the heater film and the sensor. The tiecoat may include any suitable materials available in the art for tiecoats, and may be formed using any suitable method available in the art. The transparency may further include a topcoat on the tiecoat. The topcoat may include any suitable materials available in the art for topcoats, and may be formed using any suitable method available in the art.

Methods of preparing the coating according to the present disclosure now will be described generally. For example, methods of preparing the coating may be chosen from lithographically forming (e.g., photolithographically forming), inkjet printing, aerosol jet depositing, knitting, and nano-self assembling conductive nanoparticles (e.g., methods such as physical vapor deposition, chemical solution deposition, chemical vapor deposition, or the like may be used) to form the electrically conductive lines onto at least a portion of the continuous, transparent, and electrically conductive layer. The electrically conductive lines may be formed by inkjet printing or aerosol jet printing any suitable ink or other suitable material onto the continuous, transparent, and electrically conductive layer, or formed by lithography (e.g., by utilizing a photomask having a suitable grid pattern and grid size) on at least a portion of the continuous, transparent, and electrically conductive layer. The electrically conductive lines may be formed on a separate substrate and then laminated directly onto the continuous, transparent, and electrically conductive layer. For example, the electrically conductive lines may be laminated directly onto the continuous, transparent, and electrically conductive layer by placing the electrically conductive lines and the separate substrate on the continuous, transparent, and electrically conductive layer, applying pressure to the separate substrate, and removing the separate substrate while maintaining the electrically conductive lines directly on the continuous, transparent, and electrically conductive layer.

The transparency may be a flat or shaped transparency. Accordingly, the above-described methods of preparing the transparency may also include shaping the transparency. The transparency may be shaped before, during, or after any of the above-described preparation processes. For example, the transparency may include a substrate including the continuous, transparent, and electrically conductive layer on at least a portion of the substrate, and the substrate may be shaped before, during or after the formation of the continuous, transparent, and electrically conductive layer and/or the plurality of electrically conductive lines directly on the continuous, transparent, and electrically conductive layer. The substrate may include glass, stretched acrylic, polycarbonate, polyurethane, polyethylene terephthalate (PET), or a combination thereof.

To provide the EMI shielding required for an aircraft or armor-grade transparency, the transparency may include an electrical connection, such as bus bars, but such an electrical connection may not be necessary to provide EMI shielding.

An example transparency of the present disclosure will now be described. While the following example shows the formation of electrically conductive lines by way of photomasking and electroplating, it will be understood that the present disclosure is not limited thereto and the electrically conductive lines may be formed by any suitable process, including but not limited to lithographically forming (e.g., photolithographically forming), inkjet printing, aerosol jet depositing, knitting, and nano-self assembling conductive nanoparticles (e.g., methods such as physical vapor deposition, chemical solution deposition, chemical vapor deposition, or the like may be used).

Example

A low ohm indium tin oxide (ITO) film having a sheet resistance of 1.2 ohm/sq was prepared by sputtering indium and tin from an indium and tin metallic target onto a glass substrate. The base pressure of the sputtering chamber was less than $2 \times 10^{-5}$ torr ($2.66 \times 10^{-3}$ Pascal). The deposition pressure during sputtering was $3 \times 10^{-3}$ torr (0.399 Pascal). During the sputtering of the indium and tin, argon was flowed into the chamber at a flow rate of 550 standard cubic centimeters per minute (sccm) and oxygen was flowed into the chamber at a flow rate of 350 sccm. The substrate was heated to a temperature of 650° F. (343° C.). The target was moved relative to the substrate from a first end of the substrate to a second end of the substrate at a speed of 0.4 inch/second (1.0 cm/second) for a total number of 10 loops (one loop including moving the target from the first end of the substrate to the second end of the substrate and back to the first end of the substrate).

The visible light transmittance was measured as described below. The resultant low ohm ITO film had a visible light transmittance of 78%. The sheet resistance of the resultant ITO film was measured as described below. The ITO film was determined to have a sheet resistance of 1.2 ohms/sq ($\Omega/\square$). The EMI shielding of the ITO film was measured as described below. The indium tin oxide provided EMI shielding of 35 dB to 45 dB across a range of 1 to 20 GHz (45 dB at 1 GHz and 35 dB at 18 GHz).

A plurality of electrically conductive lines were then formed as a grid on the ITO film as follows. The top surface of the ITO film was washed with acetone and isopropyl alcohol to remove any contamination. A silane coupling agent (Silquest A1100, 3-aminopropyl triethoxy silane, available from Momentive Performance Materials) was flow coated onto the ITO film. The silane coupling agent adhered to the ITO film as particles scattered across the ITO film. A photo resist (AZ P4210, available from EMD Performance Materials Corp., One International Plaza Suite, 300 Philadelphia, Pa.) was flowed over the silane primer (which promotes adhesion of the photo resist to the ITO film) in a clean room and air dried for 2 hours, and then cured in an oven at a temperature of 200° F. (93° C.).

A negative photomask was placed over the photoresist with the emulsion side down (toward the substrate) and the entire assembly was placed in a vacuum bag. The air at the interface between the photomask and the photo resist was substantially removed by using a vacuum pump to pump air out of the vacuum bag to a pressure of 30 mm Hg (4000 Pascal). The photomask was placed carefully and vacuum pumped to such that there was substantially no gap between the photomask and the ITO film. The photo resist was then exposed to ultraviolet (UV) light for 8 minutes using a Sylvania UV light 115 watt tube. The UV cured photoresist was removed using warm, diluted photoresist developer (AZ-340, available from EMD Performance Materials Corp., One International Plaza Suite 300, Philadelphia, Pa.) over a period of 5 minutes. The photoresist developer was diluted with deionized (DI) water diluting 1,500 mL of photoresist developer in 5,000 mL of deionized water.

The top and bottom of the coated substrate were wiped to remove residues of the uncured photoresist and create space for placing electrically conductive lines (a conductive braid). Electrically conductive lines were then formed in the spaces defined by the cured photoresist by using conductive silver cement to form a square grid. The electrically conductive lines directly contact the ITO film in spaces between the particles of the silane coupling agent that are scattered across the surface of the ITO film. The conductive lines of the grid had a width of 115 μm and the pitch (the distance between two adjacent electrically conductive lines of the grid) was 2,500 μm. A very thin first nickel layer, having an estimated thickness of 50 nm, was then adhered to the ITO film by nickel electroplating performed by placing the coated substrate in a nickel electroplating solution and applying a current of 4 amps for 1 minute.

A copper layer having a thickness of 4 μm was then formed over the nickel layer by copper electroplating performed by placing the coated substrate a copper electroplating solution and applying a current of 4 amps for 20 minutes. The copper layer improved the conductivity of the grid.

A thick, second nickel layer, having a thickness of 7 μm, was formed on the copper layer by nickel electroplating performed by placing the coated substrate in a nickel electroplating solution and applying a current of 4.5 amps for 50 minutes. Remaining, uncured photo resist was then removed using a sodium hydroxide solution.

The visible light transmittance and haze of the coating were measured as described below. The resultant coated substrate had a visible light transmittance of 66% and a haze of 2.9%. The sheet resistance of the ITO film of the resultant coated substrate was measured as described below. The ITO film was determined to have a sheet resistance of 1.2 ohms/square (Ω/□) and the sheet resistance of the grid over the ITO film was determined to be 0.01 ohms/square (Ω/□). The coated substrate, including the ITO film and the grid, provided EMI shielding in a frequency range of 30 MHz to 40 GHz. The bus to bus sheet resistance of the copper/nickel grid over the ITO film was equal to 0.01 ohms/square (Ω/□).

EMI Shielding Measurements

The EMI shielding measurements of the coated substrate were carried out by NTS at 1536 E. Valencia Drive, Fullerton, Calif. 92831 utilizing a Hewlett Packard 8720 C network analyzer tool according to ASTM D4395-10. For the measurements across the frequency range of 30 MHz to 1000 MHz, a Log-Periodic Antenna was used. For the measurements across the frequency range of 1000 MHz to 18 GHz, a Horn Antenna was used. For the measurements across the frequency range of 18 GHz to 40 GHz, a very high frequency small antenna was used. During the EMI measurement, IEEE Std. 299-1997 was employed.

During the EMI measurement, the transmitter was at one side of the substrate and receiver antennas were placed at the opposite side of the substrate, thereby aligning the transmitter and receiver. The shielding effectiveness of the coated substrate was measured at frequencies between 30 MHz to 1,000 MHz, 1 GHz to 18 GHz, and 18 GHz to 40 GHz. The coated substrate was determined to have a shielding effectiveness of 45 dB to 85 dB across a frequency range of 30 MHz to 1,000 MHz, 35 dB to 45 dB across a frequency range of 1 GHz to 18 GHz, and 20 dB to 35 dB across a frequency range of 18 GHz to 40 GHz.

Haze and Luminous Transmittance Tests

A 16 inch by 16 inch coupon prepared according to the Example was tested according to ASTM D1003 using a Haze-Gard Plus instrument. Haze measures the clearness and transparency of the film (the film should not be translucent and diffuse light), while the luminous or visible light transmittance indicates the amount of visible light transmitted through the sample. The haze and luminous transmittance were measured to be 2.9% and 66%, respectively.

Sheet Resistance Test

The sheet resistance of a 16 inch by 16 inch coupon prepared according to Example 1 was tested using a four point probe surface resistivity meter from Guardian Manufacturing Inc. (to measure the sheet resistance of the ITO film) and a milli ohmeter manufactured by Rohpoint was used to measure the sheet resistance of the grid (the electrically conductive lines).

The word "comprising" and forms of the word "comprising" as used in this description and in the claims does not limit the recited subject matter to exclude any variants or additions. Although various coatings of the present disclosure have been described using the terms "comprising" or "including", coatings consisting essentially of or consisting of are also within the scope of this disclosure. For example, while coatings of this disclosure have been described in terms of a coating comprising a continuous, transparent, and electrically conductive layer and a plurality of electrically conductive lines, a coating comprising a layer consisting essentially or of consisting of the continuous, transparent, and electrically conductive layer and the plurality of electrically conductive lines is also within the scope of this disclosure. In this context, "consisting essentially of" means that any additional coating components will not materially affect the EMI shielding of the coating. As used herein, the term "plurality", means two or more.

As used herein, unless otherwise expressly specified, all numbers such as those expressing values, ranges, amounts or percentages may be read as if prefaced by the word "about", even if the term does not expressly appear. Any numerical range recited herein is intended to include all sub-ranges subsumed therein. Plural encompasses singular and vice versa. For example, while coatings of the present disclosure have been described in terms of "a" continuous, transparent, and electrically conductive layer, one or more of this or other recited components may be used according to the present disclosure. Also, as used herein, the term "polymer" is meant to refer to prepolymers, oligomers, and both homopolymers and copolymers; the prefix "poly" refers to two or more. When ranges are given, any endpoints of those and/or numbers within those ranges may be combined within the scope of the present disclosure. Including and like terms means "including but not limited to". Similarly, as used herein, the terms "on" and "formed on" mean formed, overlaid, deposited, or provided on but not necessarily in contact with the surface, unless otherwise indicated. For example, a coating layer "formed on" a substrate does not preclude the presence of one or more other coating layers of the same or different composition located between the formed coating layer and the substrate, unless otherwise indicated. On the other hand, as used herein, the terms "directly on", "formed directly on", and "laminated directly on" mean in physical contact with the surface. For example, electrically conductive lines directly on, formed directly on, or laminated directly on a continuous, transparent, and electrically conductive layer are in direct physical contact with the continuous, transparent, and electrically conductive layer.

Notwithstanding that the numerical ranges and parameters setting forth the broad scope of the present disclosure are approximations, numerical values set forth in the specific examples are reported as precisely as is practical. Any numerical value, however, may inherently contain certain errors necessarily resulting from the standard variation found in their respective testing measurements.

As used herein, the terms "combination thereof" and "combinations thereof" may refer to a chemical combination (e.g., an alloy or chemical compound), a mixture, or a laminated structure of components. It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s). It will be understood that the spatially relative terms are intended to encompass different orientations of the device in use or in operation, in addition to the orientation described herein. For example, if the device is turned over, elements described as "below" or "beneath" or "under" other elements or features would then be oriented "above" the other elements or features. Thus, the example terms "below" and "under" may encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing the subject matter of the present disclosure refers to "one or more embodiments of the present disclosure." As used herein, the terms "use," "using," and "used" may be considered synonymous with the terms "utilize," "utilizing," and "utilized," respectively.

In view of the foregoing the present disclosure thus relates inter alia, without being limited thereto, to the following aspects:

1. A coating comprising:
   a continuous, transparent, and electrically conductive layer having a transmittance of visible light of 40% or higher; and
   a plurality of electrically conductive lines directly on at least a portion of the continuous, transparent, and electrically conductive layer, the electrically conductive lines having a thickness of 50 nm to 50 µm.

2. The coating of preceding aspect 1, wherein the continuous, transparent, and electrically conductive layer comprises a transparent metal oxide layer, a transparent metal layer, or a combination thereof.

3. The coating of aspect 2, wherein the transparent metal oxide layer comprises indium tin oxide (ITO), aluminum zinc oxide (AZO), antimony doped tin oxide (ATO), tin oxide (TO), fluorine doped tin oxide (FTO), or a combination thereof.

4. The coating of any one of preceding aspects 2 or 3, wherein the transparent metal layer comprises gold (Au), silver (Ag), platinum (PT), palladium (Pd), copper (Cu), aluminum (Al), nickel (Ni), chromium (Cr), hafnium (Hf), or a combination thereof.

5. The coating according to any one of preceding aspects 1 to 4, wherein the electrically conductive lines form an electrically conductive mesh.

6. The coating according to aspect 5, wherein the electrically conductive mesh has a sheet resistance of 1.0 ohm per square ($\Omega/\square$) or less as measured using bus bars.

7. The coating according to any one of the preceding aspects 1 to 6, wherein the electrically conductive lines comprise gold (Au), copper (Cu), silver (Ag), nickel (Ni), chromium (Cr), aluminum (Al), platinum (Pt), palladium (Pd), hafnium (Hf), or a combination thereof.

8. The coating according to any one of the preceding aspects, wherein the continuous, transparent, and electrically conductive layer comprises indium tin oxide (ITO) and the electrically conductive lines comprise silver (Ag).

9. The coating according to any one of the preceding aspects, wherein the coating provides electromagnetic interference (EMI) shielding of 20 dB to 95 dB across a frequency range of 30 MHz to 50 GHz as measured according to IEEE Std. 299-1997.

10. The coating of aspect 9, wherein the coating provides electromagnetic interference (EMI) shielding of 45 dB to 95 dB across a frequency range of 30 MHz to 1 GHz.

11. The coating of aspect 9, wherein the coating provides electromagnetic interference (EMI) shielding of 35 dB to 45 dB across a frequency range of 1 GHz to 18 GHz.

12. The coating of aspect 9, wherein the coating provides electromagnetic interference (EMI) shielding of 20 dB to 35 dB across a frequency range of 18 MHz to 40 GHz.

13. A coated substrate comprising:
   a substrate; and
   a coating according to any one of preceding aspects 1 to 12 on at least a portion of the substrate.

14. The coated substrate of aspect 13, wherein the substrate comprises glass, stretched acrylic, polycarbonate, polyurethane, polyethylene terephthalate (PET), or a combination thereof.

15. The coated substrate according to any one of aspects 13 or 14, further comprising a topcoat on at least a portion of the electrically conductive lines.

16. The coated substrate according to any one of aspects 13 to 15, wherein the coating is a de-icing layer.

17. The coated substrate according to any one of aspects 13 to 15, wherein the coating is an electrode of a sensor.

18. A transparency comprising the coated substrate according to any one of preceding aspects 13 to 17.

19. The transparency of aspect 18, wherein the coating provides electromagnetic interference (EMI) shielding of 20 dB to 95 dB across a frequency of 30 MHz to 50 GHz as measured according to IEEE Std. 299-1997.

20. A vehicle comprising the transparency according to any one of aspects 18 or 19.

Whereas particular embodiments of the present disclosure have been described herein for purposes of illustration, it will be evident to those skilled in the art that numerous variations of the details of the present disclosure may be made without departing from the invention as defined in the appended claims.

What is claimed is:

1. A vehicle transparency comprising:
   a coating comprising:
   a continuous, transparent, and electrically conductive layer having a transmittance of visible light of 40% or higher; and
   a heater film comprising a plurality of electrically conductive lines directly on at least a portion of the continuous, transparent, and electrically conductive layer, the electrically conductive lines having a thickness of 50 nm to 50 µm,
   wherein the plurality of electrically conductive lines are thicker than the continuous, transparent, and electrically conductive layer, and
   wherein the plurality of electrically conductive lines comprise a first nickel layer, a copper layer on the first nickel layer, and a second nickel layer on the copper layer.

2. The vehicle transparency of claim 1, wherein the continuous, transparent, and electrically conductive layer comprises a transparent metal oxide layer.

3. The vehicle transparency of claim 2, wherein the transparent metal oxide layer comprises indium tin oxide (ITO), aluminum zinc oxide (AZO), antimony doped tin oxide (ATO), tin oxide (TO), fluorine doped tin oxide (FTO), or a combination thereof.

4. The vehicle transparency of claim 1, wherein the continuous, transparent, and electrically conductive layer comprises a transparent metal layer comprising gold (Au), silver (Ag), platinum (Pt), palladium (Pd), copper (Cu), aluminum (Al), nickel (Ni), chromium (Cr), hafnium (Hf), or a combination thereof.

5. The vehicle transparency of claim 1, wherein the electrically conductive lines form an electrically conductive mesh.

6. The vehicle transparency of claim 5, wherein the electrically conductive mesh has a sheet resistance of 1.0 ohm per square (Ω/□) or less as measured using bus bars.

7. The vehicle transparency of claim 1, wherein the continuous, transparent, and electrically conductive layer comprises indium tin oxide (ITO).

8. The vehicle transparency of claim 1, wherein the coating provides electromagnetic interference (EMI) shielding of 20 dB to 95 dB across a frequency range of 30 MHz to 50 GHz as measured according to IEEE Std. 299-1997.

9. The vehicle transparency of claim 8, wherein the coating provides electromagnetic interference (EMI) shielding of 45 dB to 95 dB across a frequency range of 30 MHz to 1 GHz.

10. The vehicle transparency of claim 8, wherein the coating provides electromagnetic interference (EMI) shielding of 35 dB to 45 dB across a frequency range of 1 GHz to 18 GHz.

11. The vehicle transparency of claim 8, wherein the coating provides electromagnetic interference (EMI) shielding of 20 dB to 35 dB across a frequency range of 18 MHz to 40 GHz.

12. The vehicle transparency of claim 1, further comprising:
a substrate,
wherein the coating is on at least a portion of the substrate.

13. The vehicle transparency of claim 12, wherein the substrate comprises glass, stretched acrylic, polycarbonate, polyurethane, polyethylene terephthalate (PET), or a combination thereof.

14. The vehicle transparency of claim 12, further comprising a topcoat on at least a portion of the electrically conductive lines.

15. The vehicle transparency of claim 12, wherein the coating is configured to de-ice the coated substrate.

16. The vehicle transparency of claim 1, wherein the coating provides electromagnetic interference (EMI) shielding of 20 dB to 95 dB across a frequency range of 30 MHz to 50 GHz as measured according to IEEE Std. 299-1997.

17. A vehicle comprising the vehicle transparency of claim 1.

* * * * *